United States Patent
Ikarashi

(10) Patent No.: US 8,926,848 B2
(45) Date of Patent: Jan. 6, 2015

(54) THROUGH HOLE FORMING METHOD

(71) Applicant: Canon Kabushiki Kaisha, Tokyo (JP)

(72) Inventor: Yoichi Ikarashi, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/765,968

(22) Filed: Feb. 13, 2013

(65) Prior Publication Data

US 2013/0224958 A1    Aug. 29, 2013

(30) Foreign Application Priority Data

Feb. 23, 2012    (JP) .................................. 2012-037406

(51) Int. Cl.
*H01B 13/00*    (2006.01)
*H01L 21/308*    (2006.01)
*H01L 21/3065*    (2006.01)
*H01L 21/683*    (2006.01)
*H01L 21/768*    (2006.01)

(52) U.S. Cl.
CPC .......... *H01L 21/308* (2013.01); *H01L 21/3065* (2013.01); *H01L 21/6835* (2013.01); *H01L 21/76898* (2013.01)
USPC .................... 216/17; 216/27; 216/58; 216/65; 347/56; 347/61; 347/65; 347/67

(58) Field of Classification Search
USPC ........... 216/27, 58, 65, 17; 347/56, 61, 65, 67
See application file for complete search history.

(56) References Cited

U.S. PATENT DOCUMENTS

| | | | | | |
|---|---|---|---|---|---|
| 4,343,875 | A | * | 8/1982 | Spickenreuther | 438/700 |
| 4,961,821 | A | * | 10/1990 | Drake et al. | 438/21 |
| 7,320,513 | B2 | | 1/2008 | Kim et al. | |
| 8,162,439 | B2 | * | 4/2012 | Doi et al. | 347/44 |
| 2007/0257007 | A1 | * | 11/2007 | Kim et al. | 216/27 |
| 2008/0073320 | A1 | | 3/2008 | Kim et al. | |

FOREIGN PATENT DOCUMENTS

| | | |
|---|---|---|
| JP | 2004-152967 A | 5/2004 |
| JP | 2004-237734 A | 8/2004 |

\* cited by examiner

*Primary Examiner* — Nadine Norton
*Assistant Examiner* — Maki Angadi
(74) *Attorney, Agent, or Firm* — Fitzpatrick, Cella, Harper & Scinto

(57) ABSTRACT

Provided are a method of forming a through hole, which can inhibit misalignment between central axes of holes in both surfaces of a substrate, which is free from metal contamination, and which inhibits notching so as to improve the dimensional accuracy, the method including: preparing a silicon substrate; preparing a supporting substrate for supporting the silicon substrate; fixing the silicon substrate and the supporting substrate to form a composite substrate; and carrying out dry etching to the composite substrate from a silicon substrate side of the composite substrate toward a supporting substrate side of the composite substrate to form a through hole in the silicon substrate, in which the supporting substrate in the preparing a supporting substrate has a hole formed at a region corresponding to a region of the through hole to be formed in the silicon substrate, on a surface of the supporting substrate facing the silicon substrate.

14 Claims, 7 Drawing Sheets

THROUGH HOLE FORMING METHOD

BACKGROUND OF THE INVENTION

1. Field of the Invention

The present invention relates to a method of forming a through hole in a silicon substrate.

2. Description of the Related Art

Formation of a through hole in a silicon substrate is widely used in a manufacturing process of a semiconductor device, a MEMS device, or the like. Further, in order to improve the performance of the semiconductor device or the MEMS device, formation of a through hole with higher dimensional accuracy is required.

FIG. 8 illustrates a general method of forming a through hole in a silicon substrate by dry etching.

FIG. 8 schematically illustrates a state of an etching process after an etching mask 3 is formed in advance on a front surface of a silicon substrate 1 and an etching stop layer 10 is formed in advance on a rear surface of the silicon substrate 1.

In this state, etching gas ions 11 are caused to enter the silicon substrate 1 from the front surface side thereof and the silicon substrate 1 is etched until the etching stop layer 10 is exposed to form through holes 6.

As the material of the etching stop layer 10, generally, a silicon oxide film which is an insulator is used. Further, taking into consideration the etching rate distribution within the plane of the silicon substrate, in a region in which the etching rate is high, it is necessary to carry out overetching even after the through hole is formed, and thus, the etching stop layer 10 continues to be exposed to the etching gas ions 11 all the while during the etching process for forming the through holes 6 and the overetching process. Therefore, the etching stop layer 10 is charged, and the trajectories of the etching gas ions 11 are deflected to cause notching 12, which is etching of side walls of the through holes 6. Further, the amount of charge of the etching stop layer has a distribution, with a result that the notching 12 is caused unevenly, and thus, there is a problem that the dimensional accuracy of the through holes 6 is deteriorated.

For the purpose of inhibiting the above-mentioned deterioration of the dimensional accuracy of the through holes, Japanese Patent Application Laid-Open No. 2004-237734 discloses a method of forming a through hole without notching by forming a hole in one surface of a silicon substrate and forming another hole by dry etching in the other surface of the silicon substrate so that the holes communicate with each other.

Further, Japanese Patent Application Laid-Open No. 2004-152967 discloses a method of preventing charge and inhibiting notching by forming an etching stop layer of a conductive material.

However, in the conventional structure disclosed in Japanese Patent Application Laid-Open No. 2004-237734, the positional accuracies of the holes in both surfaces of the substrate depend on the accuracy of an alignment device, and thus, there are cases in which the central axis of the hole in the one surface and the central axis of the another hole in the other surface are misaligned.

Further, in the conventional structure disclosed in Japanese Patent Application Laid-Open No. 2004-152967, metal is used as the material of the conductive etching stop layer, and thus, there is a possibility that a problem is caused by metal contamination in a post process. For example, in a bonding method called fusion bonding, it is known that minute metal contamination causes defective bonding.

SUMMARY OF THE INVENTION

The present invention has been made in view of the above-mentioned problems, and an object of the present invention is to provide a method of forming a through hole in a silicon substrate by dry etching, which can inhibit misalignment between central axes of holes in both surfaces of a substrate, which is free from metal contamination, and which inhibits notching so as to improve the dimensional accuracy.

According to an exemplary embodiment of the present invention, there is provided a method of forming a through hole, the method including:

preparing a silicon substrate;

preparing a supporting substrate for supporting the silicon substrate;

fixing the silicon substrate and the supporting substrate to form a composite substrate; and carrying out dry etching to the composite substrate from a silicon substrate side of the composite substrate toward a supporting substrate side of the composite substrate to form a through hole in the silicon substrate, in which the supporting substrate in the preparing a supporting substrate has a hole formed at a region corresponding to a region of the through hole to be formed in the silicon substrate, on a surface of the supporting substrate facing the silicon substrate.

According to the present invention, it is possible to realize the method of forming a through hole in a silicon substrate by dry etching, which can inhibit misalignment between central axes of holes in both surfaces of the substrate, which is free from metal contamination, and which inhibits notching so as to improve the dimensional accuracy.

Further features of the present invention will become apparent from the following description of exemplary embodiments with reference to the attached drawings.

DESCRIPTION OF THE EMBODIMENTS

A method of forming a through hole in a silicon substrate by dry etching according to an embodiment of the present invention is described with reference to FIGS. 1A to 3C.

FIGS. 1A to 1D are sectional views illustrating a composite substrate forming process, a through hole forming process, and a supporting substrate removing process according to the embodiment of the present invention.

Figure 1A:
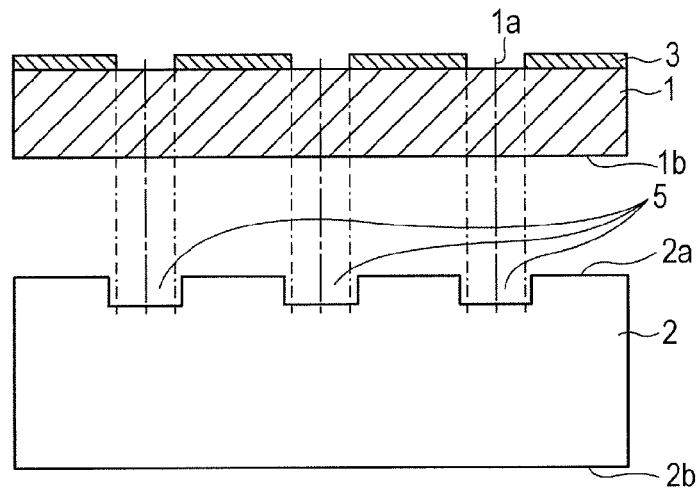
FIGS. 1A, 1B, 1C, and 1D are sectional views illustrating a composite substrate forming process, a through hole forming process, and a supporting substrate removing process according to an embodiment of the present invention.
Figure 1B:
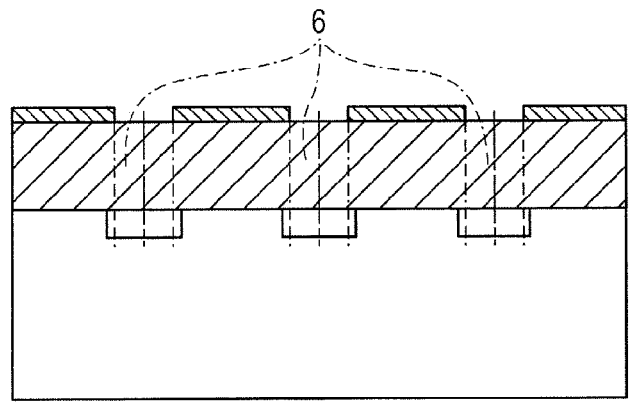

As illustrated in FIGS. 1A and 1B, a silicon substrate 1 in which a through hole is to be formed and a supporting substrate 2 for supporting the silicon substrate 1 in which the through hole is to be formed are fixed to each other to form a composite substrate under a state in which a rear surface 1b of the silicon substrate 1 and a front surface 2a of the supporting substrate 2 are held in contact with each other. Holes 5 are formed in advance in the supporting substrate 2 in regions corresponding to regions 6 of a desired through hole pattern formed on the silicon substrate 1.

Further, as illustrated in FIG. 1A, the centers of holes in an etching mask 3 on the silicon substrate 1 and the centers of the holes 5 in the supporting substrate 2 are aligned.

Therefore, as illustrated in FIG. 1B, there are hollows immediately below the regions 6 of the through holes to be formed in the silicon substrate 1.

Figure 1C:
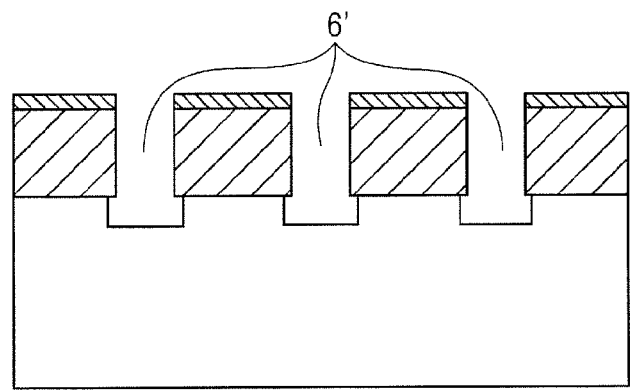

Then, as illustrated in FIG. 1C, dry etching of the composite substrate is carried out from the silicon substrate 1 side in a state of the composite substrate to form through holes 6'.

In this case, the hollows are present immediately below the regions 6 in which the through holes are formed on the rear surface 1b side of the silicon substrate 1, and thus, charge is not caused, and the through holes 6' can be formed under a state in which notching is prevented.

Further, the through holes 6' are formed only from one surface side of the substrate, and thus, there is no misalignment between central axes of holes in both surfaces due to an alignment error. Further, a metal conductive stop layer is not used, and thus, post processes are not affected by metal contamination.

Further, in this embodiment, a structure may be adopted in which the diameter of the holes 5 formed in the supporting substrate 2 is larger than the diameter of the through holes 6' formed in the silicon substrate 1.

This enables the hollows to be placed without fail immediately below the regions 6 of the through holes formed in the silicon substrate 1 even if the composite substrate of the silicon substrate 1 and the supporting substrate 2 has an alignment error when formed.

Figure 1D:
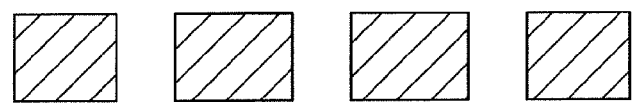

After that, as illustrated in FIG. 1D, by removing the etching mask 3 and removing the supporting substrate 2, there can be provided a silicon substrate having through holes which prevent notching and which have satisfactory dimensional accuracy formed therein.

At that time, if a separation layer is provided on a surface of the supporting substrate 2 on the side of supporting the silicon substrate 1, the supporting substrate 2 can be removed more easily.

Next, an exemplary specific configuration of the through hole forming method of this embodiment is further described.

FIGS. 1A to 3C illustrate in sequence the processes of the through hole forming method of this embodiment.

Figure 2:
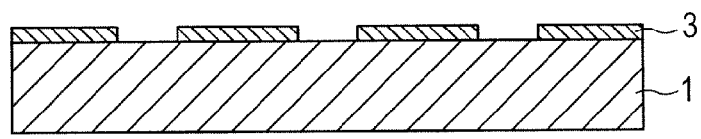
FIG. 2 is a sectional view illustrating a process of preparing a silicon substrate in which through holes are to be formed according to the embodiment of the present invention.

First, FIG. 2 illustrates a process of preparing the silicon substrate 1 in which the through holes are to be formed.

The thickness of the silicon substrate 1 is 100 to 200 μm.

The etching mask 3 is formed on the silicon substrate 1 so as to obtain the desired through hole pattern.

The etching mask 3 is formed using general photolithography or etching.

For example, the etching mask 3 is formed of a resist material having a thickness of 3 to 10 μm.

Further, openings in the etching mask 3 have a diameter of 30 to 100 μm and a pitch of 50 to 500 μm.

Next, a method of preparing the supporting substrate 2 for supporting the silicon substrate 1 in which the through holes are to be formed is described.

The holes 5 are formed in the supporting substrate 2 in the regions corresponding to the desired through hole pattern formed on the silicon substrate 1.

The material of the supporting substrate 2 is a silicon substrate or a glass substrate having a thickness of 300 to 500 μm.

Figure 3A:
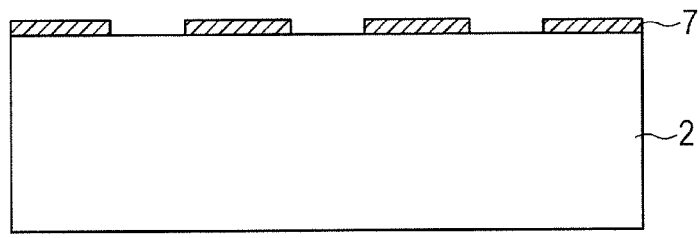
FIGS. 3A, 3B, and 3C are sectional views illustrating in sequence a process of preparing a supporting substrate according to the embodiment of the present invention.
Figure 3B:
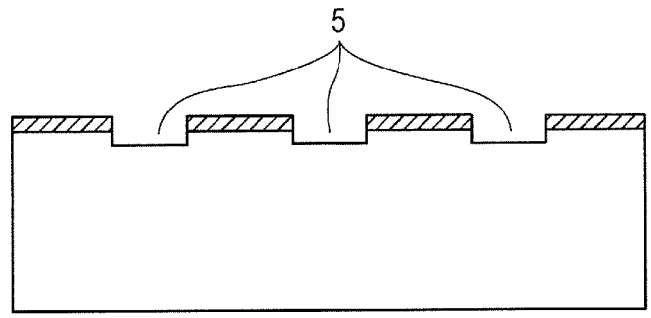
Figure 3C:
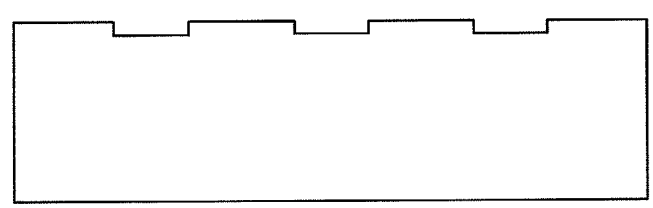

FIGS. 3A to 3C illustrate in sequence the process of the method of preparing the supporting substrate 2.

First, as illustrated in FIG. 3A, an etching mask for forming the holes 5 corresponding to the desired through hole pattern formed on the silicon substrate 1 is formed on the front surface of the supporting substrate 2. The etching mask 7 is formed using general photolithography or etching.

For example, the etching mask 7 is formed of a resist material having a thickness of 1 to 5 μm.

Further, openings in the etching mask 7 have, for example, a diameter of 35 to 400 μm and a pitch of 50 to 500 μm.

In this case, the dimensions of the etching masks 3 and 7 may be designed so that the diameter of the holes 5 to be formed in the supporting substrate 2 is larger than the diameter of the through holes 6' to be formed in the silicon substrate 1.

This enables the hollows to be placed without fail immediately below the regions 6 in which the through holes are formed in the silicon substrate 1 even if the composite substrate has an alignment error when formed by fixing the silicon substrate 1 and the supporting substrate 2 to each other.

After that, as illustrated in FIG. 3B, dry etching of the supporting substrate 2 is carried out to form the holes 5 in the regions corresponding to the regions 6 of the desired through holes formed in the silicon substrate 1.

The dry etching is reactive ion etching, and, as the etching gas, for example, $SF_6$ is used.

Further, the depth of the holes 5 may be set to the extent that the holes 5 do not penetrate the supporting substrate 2.

For example, the depth of the holes 5 is 5 to 20 μm.

Then, as illustrated in FIG. 3C, the etching mask 7 is removed.

Note that, if the etching mask 7 does not have an adverse effect in post processes, the removal of the etching mask 7 thereof is not necessary.

Next, as described above, the silicon substrate 1 and the supporting substrate 2 are fixed to each other to form the composite substrate as illustrated in FIGS. 1A to 1D.

As illustrated in FIGS. 1A and 1B, the centers of the holes in the etching mask 3 on the silicon substrate 1 and the centers of the holes 5 in the supporting substrate 2 are aligned under a state in which the rear surface 1b of the silicon substrate 1 and the front surface 2a of the supporting substrate 2 are held in contact with each other.

With regard to the method of forming the composite substrate by fixing, a method with which the supporting substrate 2 can be removed easily later is appropriately selected.

For example, bonding using an adhesive or various kinds of bonding methods may be used.

Then, as illustrated in FIG. 1C, reactive ion etching of the composite substrate is carried out from the silicon substrate 1 side in a state of the composite substrate to form through holes 6.

As the etching gas, for example, $SF_6$ is used.

In this case, dry etching of the composite substrate is required to continue until the through holes 6 are formed in the entire silicon substrate 1, and thus, there is a region in which the etching gas reaches a hole 5 in the supporting substrate 2. When the supporting substrate 2 is a silicon substrate, the supporting substrate 2 is etched at the same time. However, the holes formed in the process of preparing the supporting substrate 2 are not through holes, and the thickness of the supporting substrate 2 is adapted to have a margin so that a through hole is not formed therein by the dry etching, and thus, damage to a stage surface of a dry etching apparatus can be prevented.

After that, as illustrated in FIG. 1D, the supporting substrate 2 is removed.

The method of removing the supporting substrate 2 is selected depending on the method of forming the composite substrate by fixing.

Further, the etching mask 3 on the silicon substrate 1 is removed.

By applying the above-mentioned through hole forming method to a method of manufacturing a silicon substrate, a silicon substrate having through holes which prevent notching and which have satisfactory dimensional accuracy formed therein can be manufactured.

Example 1

As Example 1, an exemplary configuration of a through hole forming method to which the present invention is applied is described with reference to FIGS. 2 to 4E.

In the through hole forming method of this example, first, as illustrated in FIG. 2, the silicon substrate 1 in which the through holes were to be formed was prepared.

The silicon substrate 1 had a diameter of 90 mm and a thickness of 200 µm. A resist material was applied to a front surface of the silicon substrate 1 so as to have a thickness of 6 µm and photolithography was carried out to form the etching mask 3 of the resist material.

The openings in the etching mask 3 had a diameter of 100 µm and a pitch of 500 µm.

Next, as illustrated in FIGS. 3A to 3C, the supporting substrate 2 for supporting the silicon substrate in which the through holes were to be formed was prepared.

The material of the supporting substrate 2 was a silicon substrate having a diameter of 100 mm and a thickness of 500 µm.

By forming the substrate 2 of silicon, the thermal conductivity of the substrate 2 could be high and the substrate 2 could be thermally uniform when dry etching was carried out. Further, the processing of forming the holes was easy.

First, as illustrated in FIG. 3A, a resist material was applied to the front surface of the supporting substrate 2 so as to have a thickness of 3 µm and photolithography was carried out to form the etching mask 7 of the resist material.

The openings in the etching mask 7 had a diameter of 300 µm and a pitch of 500 µm.

Next, as illustrated in FIG. 3B, reactive ion etching was carried out to form the holes 5 in the supporting substrate 2.

In the reactive ion etching, an etching process and a passivation film forming process were alternately carried out, and, as the etching gas, $SF_6$ was used.

The depth of the holes 5 was 20 µm. After that, as illustrated in FIG. 3C, the resist was removed.

Then, as illustrated in FIGS. 4A to 4E, the silicon substrate 1 and the supporting substrate 2 were fixed to each other to form the composite substrate.

Figure 4A:
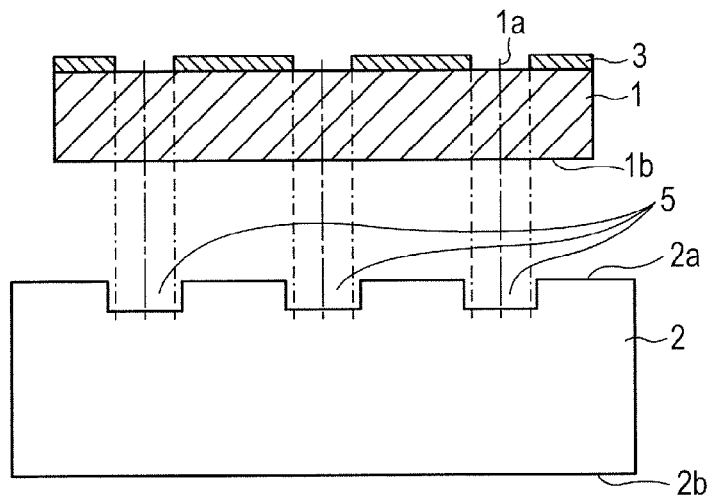
FIGS. 4A, 4B, 4C, 4D, and 4E are sectional views illustrating a composite substrate forming process, a through hole forming process, and a supporting substrate removing process according to Example 1 of the present invention.

First, as illustrated in FIG. 4A, an alignment device was used to align the centers of the holes in the etching mask 3 on the silicon substrate 1 and the centers of the holes 5 in the supporting substrate 2.

Figure 4B:
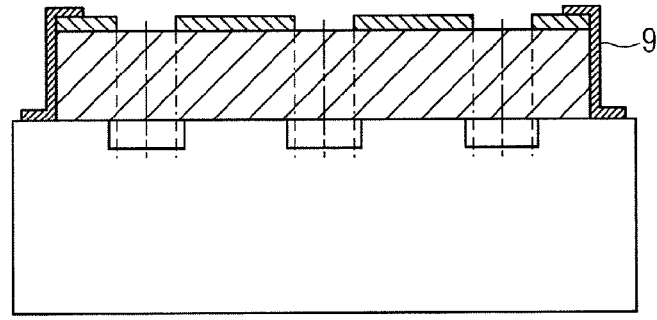

After that, as illustrated in FIG. 4B, the silicon substrate 1 and the supporting substrate 2 were brought into intimate contact with each other, and silicone grease 9 was applied to the perimeter of the silicon substrate 1 and to a portion of the supporting substrate 2 in proximity to the perimeter of the silicon substrate 1 to fix the silicon substrate 1 and the supporting substrate 2 to each other.

In this case, taking into consideration an error of the alignment device and misalignment when the grease was applied, the diameter of the openings in the etching mask 7 was 300 µm, which was larger than the diameter of 100 µm of the openings in the etching mask 3.

Further, the diameter of the supporting substrate 2 was 100 mm, which was larger than the diameter of 90 mm of the silicon substrate 1, and thus, grease 9 could be prevented from going around to reach an edge or a rear surface of the supporting substrate 2.

Figure 4C:
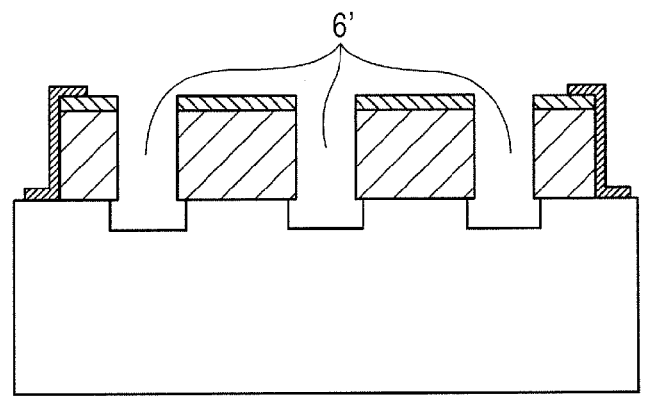

Then, as illustrated in FIG. 4C, reactive ion etching of the composite substrate was carried out from the silicon substrate 1 side in a state of the composite substrate to form the through holes 6'.

In the reactive ion etching, an etching process and a passivation film forming process were alternately carried out, and, as the etching gas, $SF_6$ was used.

Figure 4D:
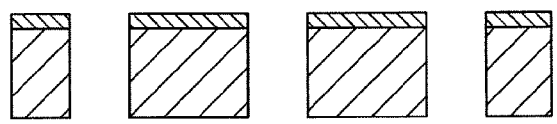
Figure 4E:
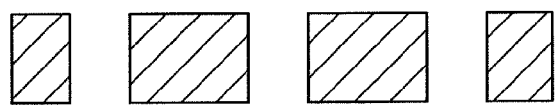

After that, as illustrated in FIG. 4D, the silicone grease 9 was wiped off with a waste cloth, and the supporting substrate 2 was removed from the silicon substrate 1. Further, as illustrated in FIG. 4E, the etching mask 3 was removed.

By applying the above-mentioned through hole forming method to a method of manufacturing a silicon substrate, a silicon substrate having through holes which prevent notching have are with satisfactory dimensional accuracy formed therein can be manufactured.

Example 2

As Example 2, an exemplary configuration different from that of Example 1 is described with reference to FIGS. 2 and 5A to 7E.

In the through hole forming method of this example, first, as illustrated in FIG. 2, the silicon substrate 1 was prepared.

The silicon substrate 1 had a diameter of 100 mm and a thickness of 200 µm.

The openings in the etching mask 3 had a diameter of 30 µm and a pitch of 50 µm.

The etching mask 3 was formed in the same manner as Example 1.

Next, as illustrated in FIGS. 5A to 5E, the supporting substrate 2 was prepared.

The material of the supporting substrate 2 was a silicon substrate having a diameter of 100 mm and a thickness of 500 µm.

Figure 5A:
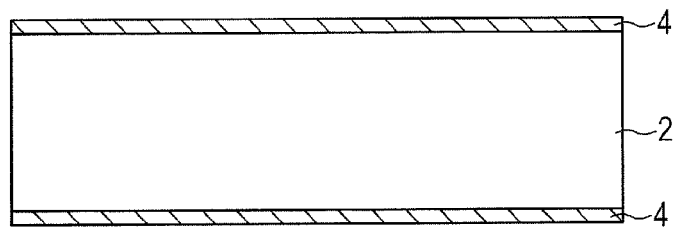
FIGS. 5A, 5B, 5C, 5D, and 5E are sectional views illustrating in sequence a process of preparing a supporting substrate according to Example 2 of the present invention.
Figure 5B:
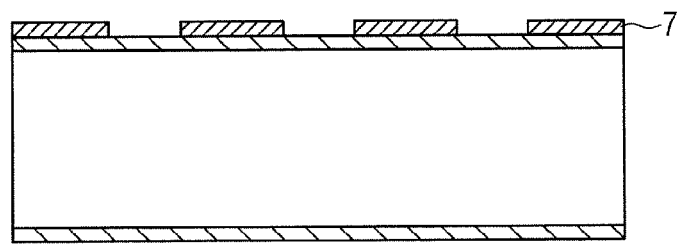

First, as illustrated in FIG. 5A, a silicon oxide film 4 having a thickness of 500 nm was formed on the supporting substrate 2 by thermal oxidation. After that, as illustrated in FIG. 5B, a photoresist was applied on the silicon oxide film 4 so as to have a thickness of 3 µm, and the etching mask 7 was formed by photolithography.

Figure 5C:
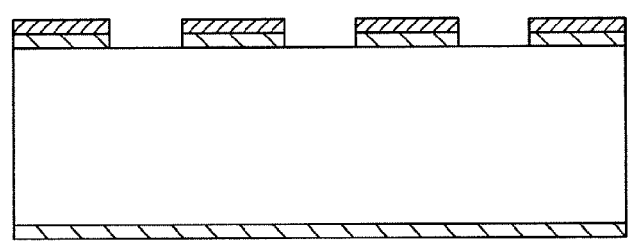

The openings in the etching mask 7 had a diameter of 35 μm and a pitch of 50 μm. After that, as illustrated in FIG. 5C, the silicon oxide film 4 was etched by reactive ion etching.

As the etching gas, $CHF_3$ (trifluoromethane) was used.

Figure 5D:
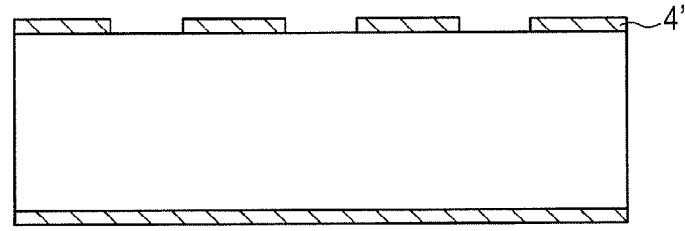

Further, as illustrated in FIG. 5D, the resist layer was removed to form an etching mask 4' of the silicon oxide film.

Figure 5E:
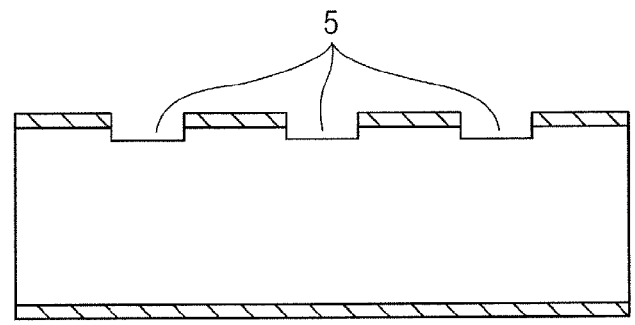

In this state, as illustrated in FIG. 5E, reactive ion etching was carried out to form the holes 5 having a depth of 20 μm in the supporting substrate 2.

In the reactive ion etching, an etching process and a passivation film forming process were alternately carried out, and, as the etching gas, $SF_6$ was used.

Further, the etching mask 4' of the silicon oxide film was not removed, and was used as a separation layer when the supporting substrate 2 was removed from the silicon substrate 1 afterwards.

Figure 6A:
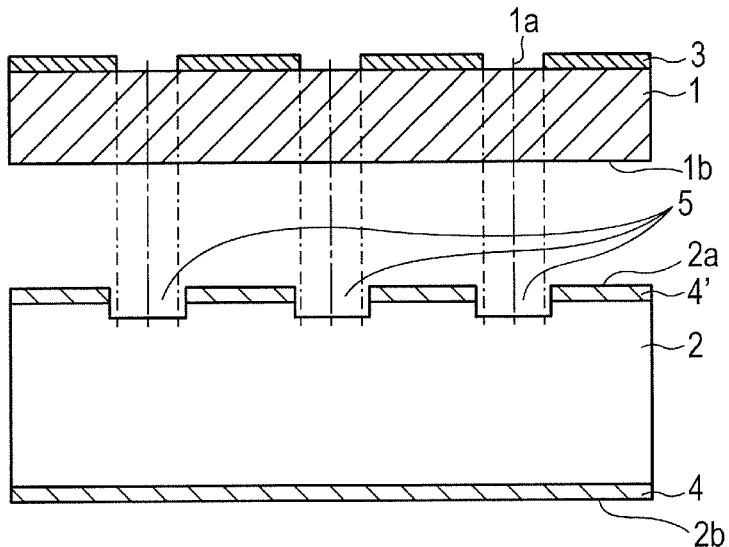
FIGS. 6A, 6B, and 6C are sectional views illustrating a composite substrate forming process and a through hole forming process according to Example 2 of the present invention.
Figure 6B:
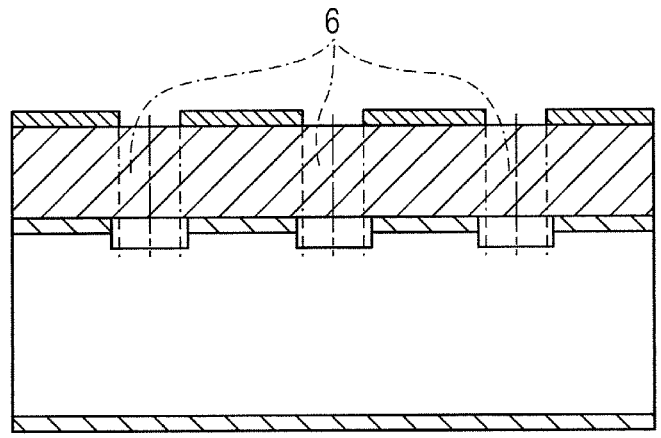
Figure 6C:
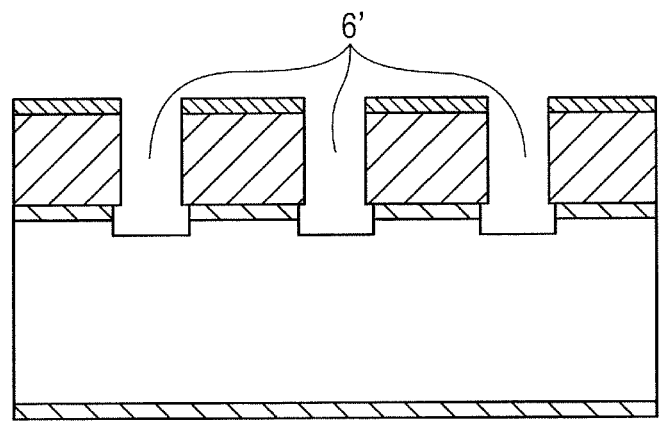

Then, as illustrated in FIGS. 6A to 6C, the silicon substrate 1 and the supporting substrate 2 were fixed to each other to form the composite substrate.

First, as illustrated in FIG. 6A, an alignment device was used to align the centers of the holes in the etching mask 3 on the silicon substrate 1 and the centers of the holes 5 in the supporting substrate 2.

With regard to the fixing method, as illustrated in FIGS. 6A and 6B, silicon of the rear surface 1b of the silicon substrate 1 and the silicon oxide film 4' on the supporting substrate 2 were bonded together by fusion bonding.

The fusion bonding facilitates removal of the supporting substrate 2 later with the silicon oxide film 4' being used as a separation layer.

Further, as the silicon oxide film 4' on the supporting substrate 2, the etching mask 4' was used as it was which was used for forming the holes 5 in the supporting substrate 2, and thus, it is not necessary to form an additional bonding layer.

Note that, an alignment error of a bonding device is generally ±2 μm or less, and thus, by increasing the diameter of the holes formed in the supporting substrate 2 by 5 μm or more than the diameter of the through holes formed in the silicon substrate 1, the hollows are placed immediately below the regions 6 in which the through holes are formed in the silicon substrate 1.

Then, as illustrated in FIG. 6C, reactive ion etching of the composite substrate was carried out from the silicon substrate 1 side in a state of the composite substrate to form the through holes 6'.

In the reactive ion etching, an etching process and a passivation film forming process were alternately carried out, and, as the etching gas, $SF_6$ was used.

Next, a method of removing the supporting substrate 2 after the dry etching is described.

Figure 7A:
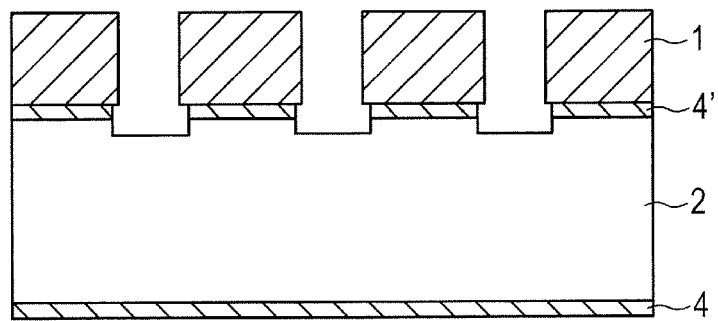
FIGS. 7A, 7B, 7C, 7D, and 7E are sectional views illustrating a supporting substrate removing process according to Example 2 of the present invention.

First, as illustrated in FIG. 7A, the etching mask 3 on the silicon substrate 1 was removed.

Figure 7B:
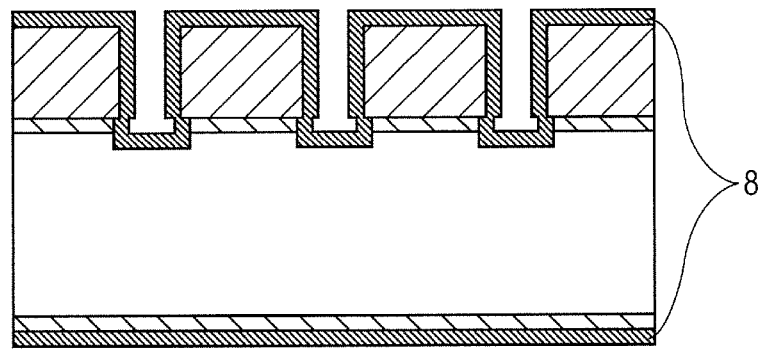

Then, as illustrated in FIG. 7B, a silicon oxide film 8 having a thickness of 500 nm was formed on the entire surface of the composite substrate by thermal oxidation.

Figure 7C:
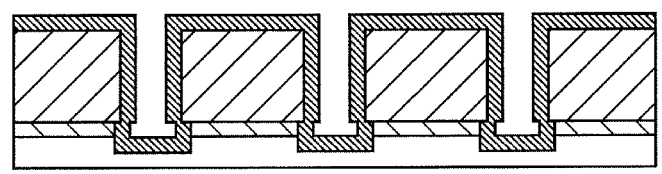

In this state, as illustrated in FIG. 7C, grinding of the supporting substrate 2 was carried out from a surface opposite to the surface in which the holes 5 were formed to reduce the thickness of the supporting substrate 2.

Figure 7D:
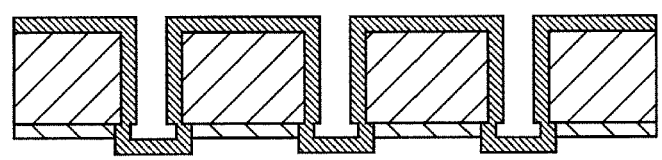

Grinding was carried out by about 400 pm to reduce the thickness of the supporting substrate 2 to be 100 μm. After that, as illustrated in FIG. 7D, wet etching using tetramethylammonium hydroxide (TMAH) was carried out to remove silicon of the supporting substrate 2.

In this case, the silicon oxide film 8 was a stop layer of the etching using TMAH, and thus, only the supporting substrate 2 could be removed with the silicon oxide film 4' being used as a separation layer.

Further, the silicon oxide film 8 was formed so as to protect the silicon substrate 1 from being etched in the wet etching.

The rate of wet etching of silicon is generally slow, but, as illustrated in FIG. 7C, by reducing the thickness of the supporting substrate 2 by grinding, time taken to carry out the wet etching could be reduced.

Figure 7E:
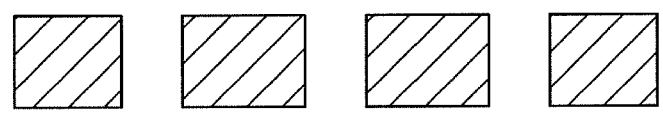
Figure 8:
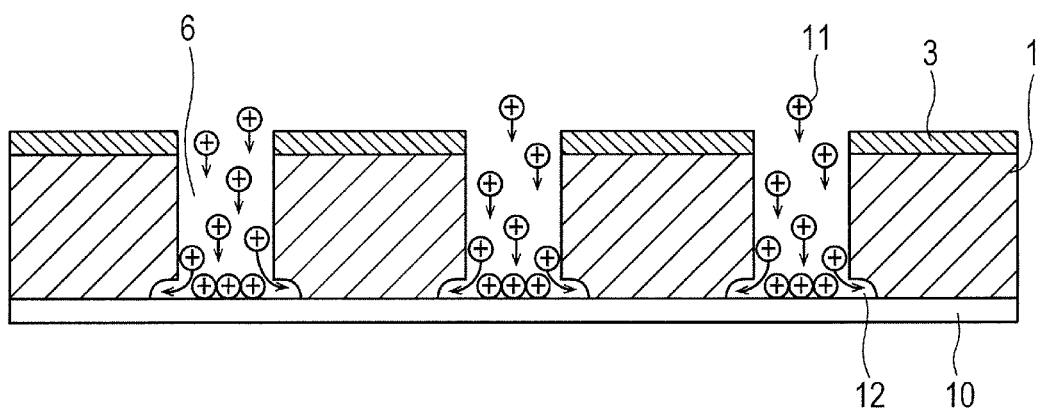
FIG. 8 is a sectional view illustrating a notching phenomenon in a general through hole forming process.

After that, as illustrated in FIG. 7E, the silicon oxide films 4' and 8 existing on the silicon substrate 1 were removed by wet etching using buffered hydrofluoric acid (BHF).

According to this method, the silicon substrate 1 and the supporting substrate 2 can be fixed to each other while being held in intimate contact with each other.

By applying the above-mentioned through hole forming method to a method of manufacturing a silicon substrate, a silicon substrate having through holes which reduce variations in inhibition of notching and which have satisfactory dimensional accuracy formed therein can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-037406, filed Feb. 23, 2012, which is hereby incorporated by reference herein in its entirety.

What is claimed is:

1. A method of forming a through hole, comprising:
preparing a silicon substrate;
preparing a supporting substrate having a hole;
combining the silicon substrate and the supporting substrate to form a composite substrate, where the combining comprises aligning the hole in the supporting substrate with a region of the silicon substrate at which a through hole is to be formed; and
dry etching the composite substrate from a silicon substrate side of the composite substrate toward a supporting substrate side of the composite substrate to form the through hole in the silicon substrate, connecting an etched region of the silicon substrate to the hole in the supporting substrate.

2. The method of forming a through hole according to claim 1, wherein a diameter of the hole in the supporting substrate is larger than a diameter of the through hole formed in the silicon substrate.

3. The method of forming a through hole according to claim 1, further comprising removing the supporting substrate from the composite substrate after the dry etching.

4. The method of forming a through hole according to claim 3, wherein the supporting substrate comprises a separation layer on a surface thereof facing the silicon substrate.

5. The method of forming a through hole according to claim 1, wherein the preparing of the supporting substrate includes forming the hole therein by reactive ion etching.

6. The method of forming a through hole according to claim 5, wherein the supporting substrate is a substrate comprising silicon.

7. The method of forming a through hole according to claim 5, wherein the reactive ion etching comprises forming a passivation film on the supporting substrate and etching the supporting substrate using a patterned passivation film as an etching mask.

8. The method of forming a through hole according to claim 5, wherein one of sulfur hexafluoride gas and trifluoromethane gas is used as an etchant in the reactive ion etching.

9. The method of forming a through hole according to claim 1, further comprising:
   forming an etching mask on the silicon substrate correspondingly to the through hole to be formed;
   bonding together the silicon substrate and the supporting substrate having the hole formed therein to form a composite;
   after the bonding, dry etching at least the silicon substrate; and
   removing selectively the supporting substrate from the composite by etching from a surface of the supporting substrate which is opposite to the surface in which the hole is formed.

10. The method of forming a through hole according to claim 9, further comprising, after the dry etching and before the removing selectively the supporting substrate, forming an etching stop layer from the silicon substrate side of the composite.

11. The method of forming a through hole according to claim 10, wherein the forming of the etching stop layer comprises forming a silicon oxide film on the composite by thermal oxidation.

12. The method of forming a through hole according to claim 11, further comprising, after the removing selectively the supporting substrate, removing the silicon oxide film by wet etching using buffered hydrofluoric acid as an etchant.

13. The method of forming a through hole according to claim 9, wherein the removing selectively the supporting substrate is carried out by wet etching.

14. The method of forming a through hole according to claim 13, wherein tetramethylammonium hydroxide is used as an etchant in the wet etching.

* * * * *